(12) United States Patent
Yang et al.

(10) Patent No.: US 7,825,730 B2
(45) Date of Patent: Nov. 2, 2010

(54) BIAS CIRCUIT FOR THE WIRELESS TRANSCEIVER

(75) Inventors: John-San Yang, Hsinchu (TW); Shu-Fen Wei, Hsinchu (TW)

(73) Assignee: Airoha Technology Corp., Hsinchu (TW)

(*) Notice: Subject to any disclaimer, the term of this patent is extended or adjusted under 35 U.S.C. 154(b) by 137 days.

(21) Appl. No.: 12/167,530

(22) Filed: Jul. 3, 2008

(65) Prior Publication Data
US 2009/0091392 A1    Apr. 9, 2009

(30) Foreign Application Priority Data
Oct. 3, 2007    (TW) ................ 96137083 A

(51) Int. Cl.
*H03G 3/10*    (2006.01)
(52) U.S. Cl. .................. 330/285; 330/253; 330/257
(58) Field of Classification Search .......... 330/285, 330/253, 257
See application file for complete search history.

(56) References Cited

U.S. PATENT DOCUMENTS

| 5,159,206 A * | 10/1992 | Tsay et al. ............... 327/143 |
| 6,304,109 B1 * | 10/2001 | Brokaw .................... 327/73 |
| 6,400,218 B1 * | 6/2002 | Zocher et al. ............. 327/560 |
| 6,456,141 B1 * | 9/2002 | Nishizono et al. ......... 327/345 |
| 6,710,659 B2 * | 3/2004 | Teramoto et al. ......... 330/254 |
| 6,734,817 B2 * | 5/2004 | Naka et al. ............... 341/155 |
| 6,914,812 B2 * | 7/2005 | Owen .................. 365/185.02 |

FOREIGN PATENT DOCUMENTS

| CN | 2438134 Y | 7/2001 |
| CN | 1750391 A | 3/2006 |

* cited by examiner

*Primary Examiner*—Patricia Nguyen
(74) *Attorney, Agent, or Firm*—Muncy, Geissler, Olds & Lowe, PLLC

(57) ABSTRACT

A bias circuit for the wireless transceiver is disclosed, which can be used for modulating the gain of the amplifier. The bias circuit comprises a first stage bias unit for receiving a constant current, a control voltage, and a first reference voltage and outputting a first outputting current, wherein the control voltage is used for controlling the value of the first outputting current, and further, the first outputting current can be increased or decreased by representing as an analog form, thus, the gain of the amplifier can be modulated according to the first outputting current, and the modulation of the gain can be represented as an analog form, such that the transient response occurred while the gain is modulated can be reduced.

21 Claims, 13 Drawing Sheets

BIAS CIRCUIT FOR THE WIRELESS TRANSCEIVER

FIELD OF THE INVENTION

The present invention relates to a bias circuit for the wireless transceiver, and more particularly to a bias circuit that can be used for modulating the gain of the amplifier, therefore, the transient response can be reduced during the gain modulation of the amplifier.

BACKGROUND OF THE INVENTION

Referring to FIG. 1, a front end circuit diagram of the prior art is showed. The front-end circuit 10 of the transceiver comprises an antenna 11, an amplifier 13, a mixer 15, and a local oscillator 17, wherein the antenna 11 is used for receiving a signal, such as a radio frequency (RF) signal or an analog signal, and transmitting the receiving signal to the amplifier 13 to be amplified, wherein the amplifier 13 is a low noise amplifier (LNA), thereafter, the amplified signal will be resulted to an intermediate frequency (IF) signal through the mixer 15 and the local oscillator 17, therefore, due to the previous frequency down conversion, the rear-end circuit of the transceiver can work according to the IF signal.

Generally, the gain of the amplifier can be modulated according to the strength value of the receiving signal through the antenna 11, for example, while the receiving signal is weaker, the gain of the amplifier 13 should be amplified properly, and thereby the rear-end circuit of the transceiver can work accordingly. On the contrary, while the receiving signal is stronger, the gain of the amplifier 13 should be reduced properly.

The gain of the amplifier 13 can be controlled according to the controller 19 connected with the amplifier 13, wherein the controller 19 is used for controlling the gain modulation according to the multi-level digital scaling, that is, the controller 19 would modulate the gain of the amplifier 13 according to the strength value of the receiving signal through the antenna 11.

However, there is a problem occurred while the gain of the amplifier 13 is modulated by the controller 19, that is, due to the controller 19 modulates the gain of the amplifier by the digital control signal, the transient response would be occurred since the gain is modulated to increase or decrease, therefore, the amplifier 13 would amplify the signal practically since the transient response has gone, thus, the operation performance of the front-end circuit 10 of the transceiver will be affected.

Furthermore, the value of the digital control signal would be determined by the strength value of amplified signal outputted from the amplifier 13, wherein the strength value of amplified signal will be detected by the rear-end circuit. However, the detection of the rear-end circuit has to be processed after the transient response has gone, otherwise, the detection thereof would be failure, such as the strength value of the transient response would be detected, thereafter, the gain modulation would be incorrect. Thus, due to the detection of the rear-end circuit has to be processed after the transient response has gone, and further, the gain will be modulated by the controller 19, therefore, the detection error might be occurred accordingly and the operation performance of the wireless transceiver would be reduced.

SUMMARY OF THE INVENTION

A bias circuit used for modulating the gain of the amplifier within the wireless transceiver is disclosed, which can prevent the transient response from the gain modulation and improve the efficiency of receiving the signal by the wireless transceiver.

It is a primary object of the present invention to provide a bias circuit for the transceiver, wherein the bias circuit is used for modulating the gain of the amplifier, and the variation of the gain modulation is an analog form as a smooth curve, such that the transient response would be prevented during the gain modulation.

It is a secondary object of the present invention to provide a bias circuit for the transceiver, wherein the bias circuit can output a smooth outputting current, which is increased or decreased by representing as an analog form, such that the gain modulation is processed as analog correspondingly.

It is another object of the present invention to provide a bias circuit for the transceiver, wherein the bias circuit is connected to the amplifier through a converter, which is used for converting the outputting current from the bias circuit into a regulating voltage, such that the gain modulation of the amplifier can be took the advantages accordingly.

It is another object of the present invention to provide a bias circuit for the transceiver, wherein the amplifier thereof comprises a modulating unit, which is used for modulate the gain of the amplifier, and further, the range of gain modulation can be larger.

To achieve the previous mentioned objects, the present invention provides a bias circuit for the wireless transceiver, comprising a first stage bias unit for receiving a constant current, a control voltage, and a first reference voltage and outputting a first outputting current according to the constant current, the control voltage, and the first reference voltage, wherein the value of the first outputting current is controlled by the control voltage, and increased or decreased by representing as an analog form.

To achieve the previous mentioned objects, the present invention further provides a bias circuit for the wireless transceiver, comprising a constant current unit for generating a bias current; a first differential unit connected to the constant current unit for receiving a control voltage, a reference voltage, and the bias current; a first current mirror connected to the first differential unit, generating a first outputting current; and a load unit connected to the first differential unit.

To achieve the previous mentioned objects, the present invention further provides A bias circuit for the wireless transceiver, comprising: a first stage bias unit, comprising: a constant current unit for generating a bias current; a first differential unit connected to the constant current unit for receiving a control voltage, a first reference voltage, and the bias current; a first current mirror connected to the first differential unit, generating a first outputting current; and a second current mirror connected to the first differential unit, generating a second outputting current; and a second stage bias unit, comprising: a third current mirror connected to the second current mirror for receiving the second current generated from the second current mirror; a second differential unit connected to the third current mirror for receiving the control voltage and a second reference voltage; a load unit connected to the second differential unit; and a fourth current mirror connected to the second differential unit for generating a third outputting current.

BRIEF DESCRIPTION OF THE DRAWINGS

It will be understood that the figures are not to scale since the individual layers are too thin and the thickness differences of various layers too great to permit depiction to scale.

DETAILED DESCRIPTION OF THE INVENTION

The structural features and the effects to be achieved may further be understood and appreciated by reference to the presently preferred embodiments together with the detailed description.

Figure 1:
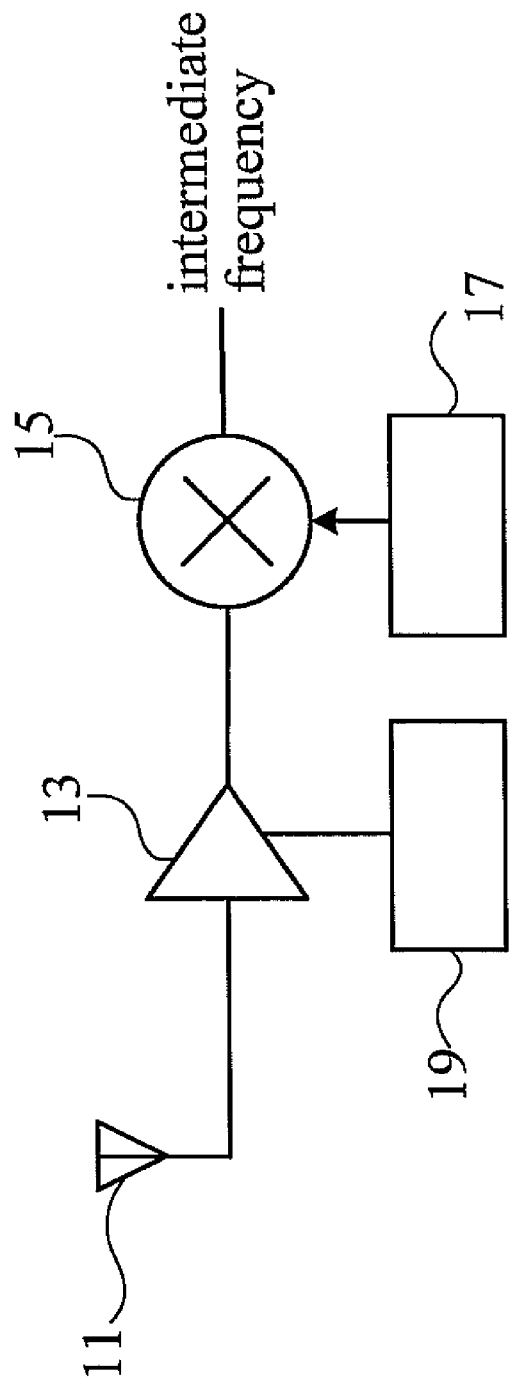
FIG. 1 shows a front-end circuit diagram of prior art wireless transceiver.
Figure 2:
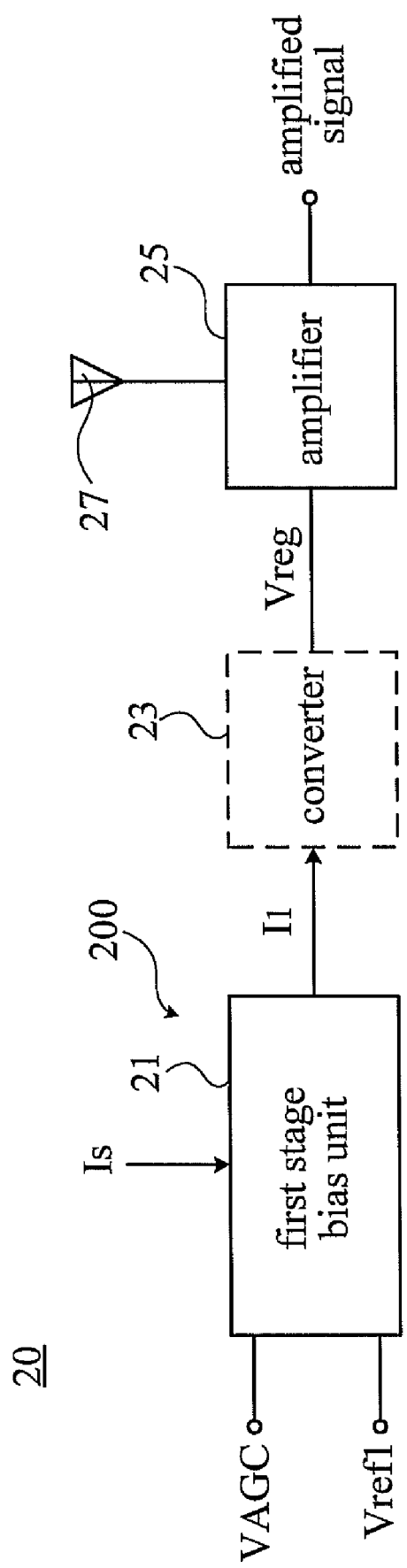
FIG. 2 is a block diagram of a preferred embodiment of the present invention regarding to a bias circuit for the wireless transceiver.

Referring to FIG. 2, a block diagram of a preferred embodiment of the present invention regarding to a bias circuit for the wireless transceiver is showed. The wireless transceiver 20 comprises a bias circuit 200, an amplifier 25, and an antenna 27, wherein the bias circuit 200 comprises a first stage bias unit 21, and the amplifier 25 is connected with the first stage bias unit 21 and the antenna 27 respectively, and used for amplifying the receiving signal through the antenna 27, such as the receiving signal can be a radio frequency signal or an analog signal. The gain of the amplifier 25 can be modulated by the first stage bias unit 21, for example, the gain of the amplifier 25 is modulated by the first outputting current I1 outputted from the first stage bias unit 21, according to the strength value of the receiving signal through the antenna 27, therefore, the amplified signal outputted from the amplifier 25 can be supportable for the requirement of the rear-end circuit (hidden).

The first stage bias unit 21 is used for receiving a constant current Is, a control voltage VAGC, and a first reference voltage Vref1, and generating a first outputting current I1 according to the constant current Is, the control voltage VAGC, and the first reference voltage Vref1. Therefore, the first outputting current I1 can be with smooth outputting curve, and increased or decreased by representing as an analog form. The first reference voltage Vref1 is a constant voltage, and the control voltage VAGC is a variable voltage, that is, the value of the first outputting current I1 can be regulated according to the alteration of the control voltage VAGC.

Regarding to the first stage bias unit 21 of the present invention, the gain of the amplifier 25 is modulated according to the regulation of current; furthermore, the gain of the amplifier 25 can be modulated according to the regulation of voltage as well once the requirement of the amplifier 25 is different. For example, a converter 23 can be provided between the first stage bias unit 21 and the amplifier 25, and used for converting the first outputting current I1 into a regulating voltage Vreg, thereafter, the gain of the amplifier 25 can be modulated according to the regulating voltage Vreg. Certainly, the regulating voltage Vreg would be altered according to the first outputting current I1, therefore, the control voltage VAGC can be used for controlling the regulating voltage Vreg and the gain of the amplifier 25 accordingly.

Regarding to the foregoing mentioned embodiment of the present invention, the gain of the amplifier 25 is controlled by the first outputting current I1 or the regulating voltage Vreg, and the curve representing the gain thereof is related to the curve alteration representing the first outputting current I1 or the regulating voltage Vreg. Therefore, due to the first stage bias unit 21 is provided, the curves representing the first outputting current I1 and the regulating voltage Vreg are as an analog outputting curve, accordingly, the gain of the amplifier 25 will be modulated by representing as an analog form, and the transient response can be prevented during the gain modulation.

Figure 3:
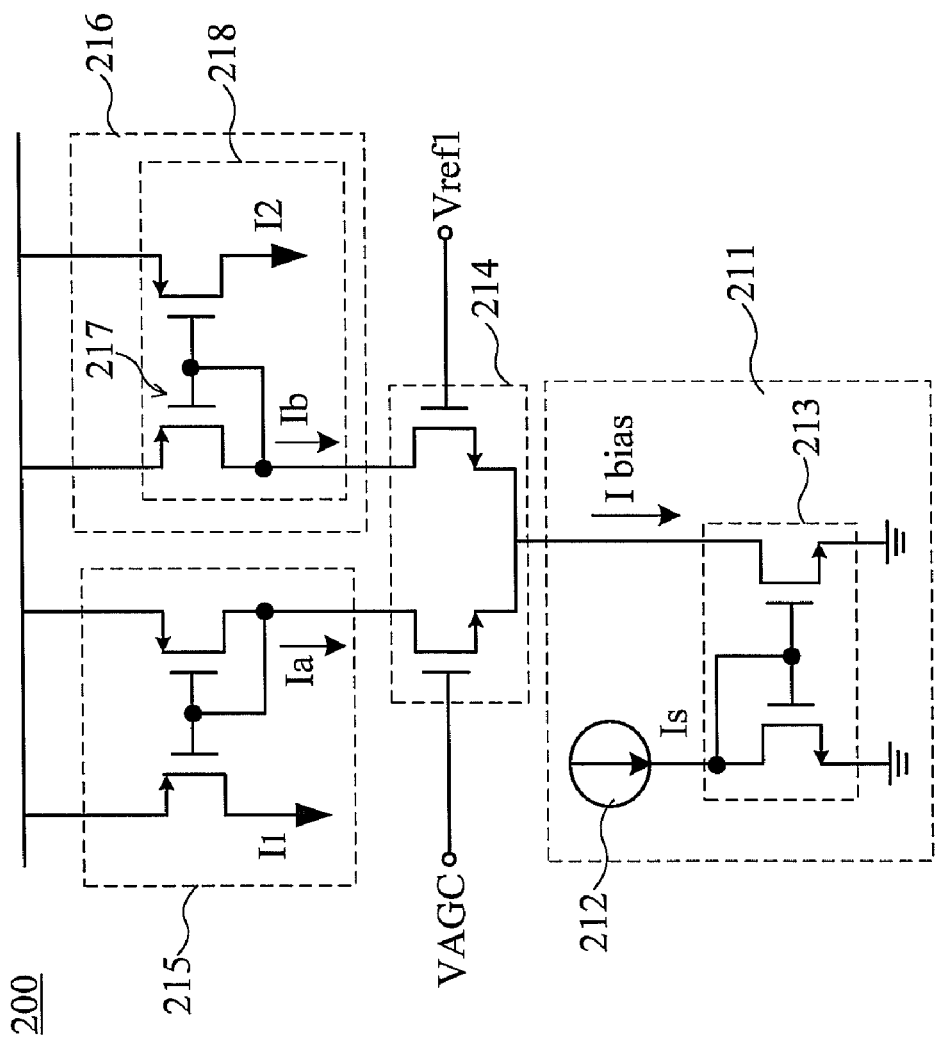
FIG. 3 is a circuit diagram of the preferred embodiment of the present invention regarding to the bias circuit.
Figure 4:
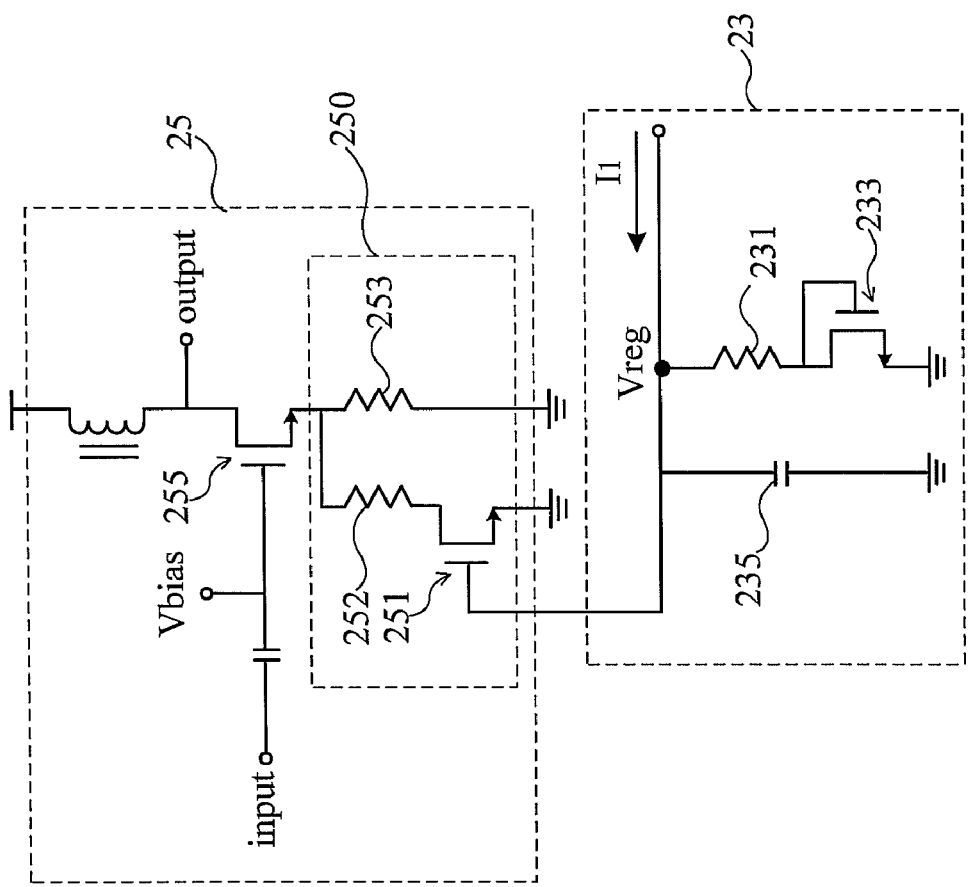
FIG. 4 is a circuit diagram of the preferred embodiment of the present invention regarding to the amplifier that is connected to the bias circuit.

Referring to FIG. 3 and FIG. 4, the bias circuit 200 comprises a constant current unit 211, a first differential unit 214, a first current mirror 215, and a load unit 216, wherein the first differential unit 214 is connected with the constant current unit 211, the first current mirror 215, and the load unit 216 respectively, and used for receiving the bias current Ibias generated from the constant current unit 211.

The constant current unit 211 comprises a constant current source 212 and a current mirror circuit 213, wherein the current mirror circuit 213 is connected to the constant current source 212, for mirroring the constant current Is of the constant current source 212, and generating the bias current Ibias that is received by the first differential unit 214.

The first differential unit 214 is used for receiving a control voltage VAGC, a first reference voltage Vref1, and the bias current Ibias generated from the constant current unit 211, and further generating currents Ia and Ib according to the control voltage VAGC, the first reference voltage Vref1, and the bias current Ibias.

The first current mirror 215 is used for mirroring the current Ia of the first differential unit 214, and generating a first outputting current I1, furthermore, the first outputting current I1 of the bias circuit 200 would be regulated according to the value of the control voltage VAGC. For example, while the control voltage VAGC is increased, the current Ia would be increased as well, and the current Ib would be decreased since the current Ia is increased, accordingly, the first outputting current I1 would be increased since the current Ia is increased, therefore, the first outputting current I1 can be controlled according to the value of the control voltage VAGC.

Figure 5:
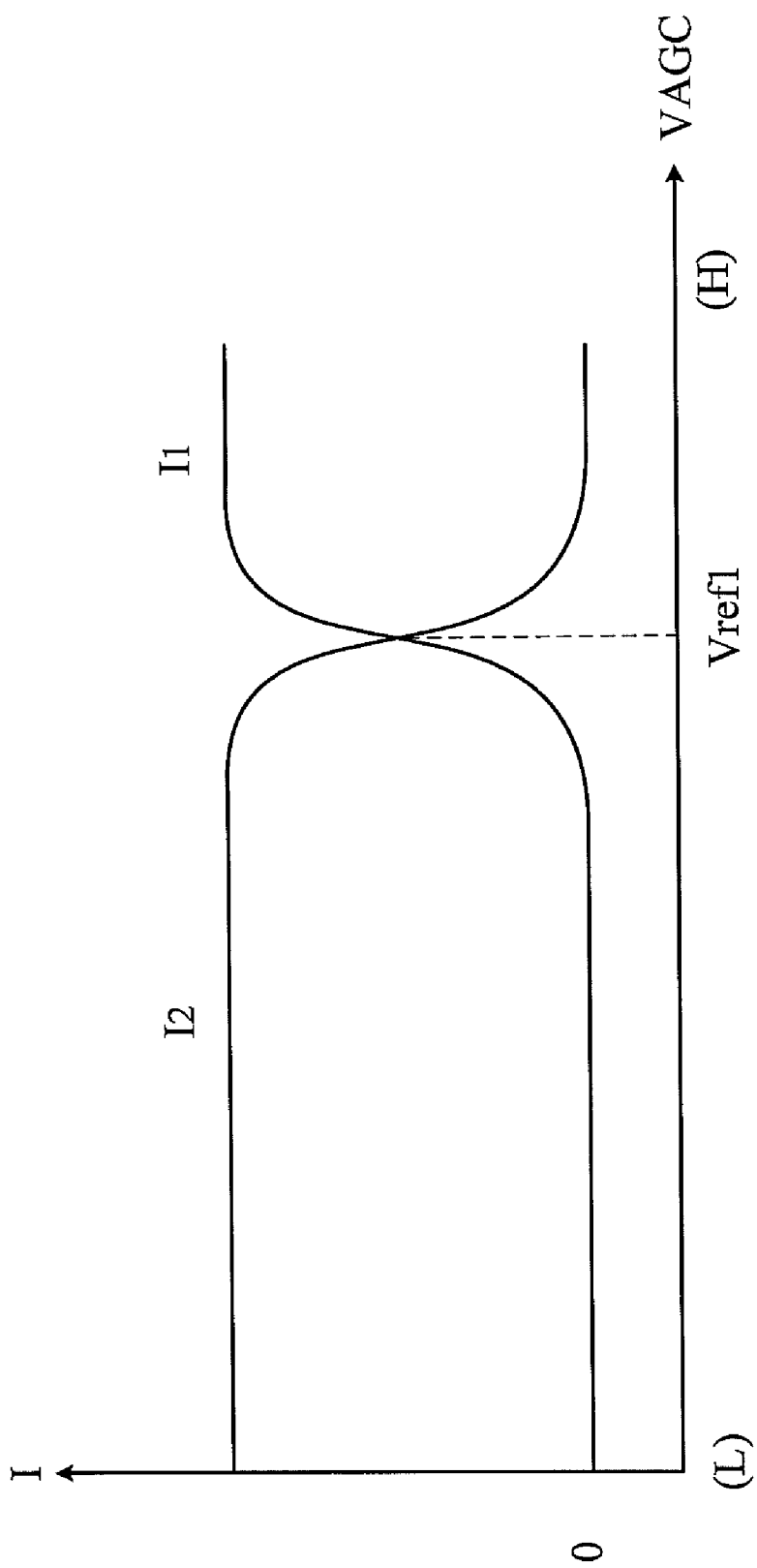
FIG. 5 is an outputting current curve diagram of the preferred embodiment of the present invention regarding to the bias circuit.

Regarding to another embodiment of the present invention, the bias circuit 200 comprises a load unit 216, which can be selectively as a transistor 217, a second current mirror 218, or a resistor, etc. . . . Once the load unit 216 is a second current mirror 218, the second current mirror 218 would mirror the current Ib of the first differential unit 214 and generate a second outputting current I2. Furthermore, the current Ib and the second outputting current I2 both can be regulated according to the control voltage VAGC, and the second outputting current I2 is regulated according to the opposite of the first outputting current I1, such as while the first outputting current I1 is increased, the second outputting current I2 would be decreased, as shown on FIG. 5.

Practically, the bias circuit 200 is connected to a converter 23 or an amplifier 25, for example, the first current mirror 215 of the bias circuit 200 is connected to the converter 23 and/or the amplifier 25. While the converter 23 is connected to the first current mirror 215 of the bias circuit 200, the converter 23 would receive the first outputting current I1 and convert into a regulating voltage Vreg. The amplifier 25 is connected to the converter 23 and used for receiving the regulating voltage Vreg, therefore, the gain of the amplifier 25 can be modulated by controlling the regulating voltage Vreg, and further, the receiving signal would be amplified properly according to the modulated gain of the amplifier 25.

The converter 23 comprises a resistor 231 and a transistor 233, both of which are connected in series, for example, the resistor 231 is connected to the drain of the transistor 23, and the gate and the drain of the transistor 23 are connected together. After the first outputting current I1 has flowed into the converter 23, portion of the first outputting current I1 will pass through the resistor 231 and the transistor 233. Therefore, a regulating voltage Vreg is loaded on the series connection of the resistor 231 and the transistor 233, and the regulating voltage can be increased according to the first outputting current I1. Regarding to another embodiment of the present invention, the converter 23 further comprises a capacitor 235, which is connected with the resistor 231 and the transistor 233 in parallel for stabling the value of the regulating voltage Vreg.

The amplifier 25 comprises an amplifying transistor 255 and a modulating unit 250, wherein the amplifying transistor 255 is connected to the bias circuit 200 or the converter 23 through the modulating unit 250; for example, the modulating unit 250 comprises a regulating transistor 251 and resistors 252 and 253. The source of the amplifying transistor 255 is connected with the resistors 252 and 253, and the resistor 252 is further connected with a regulating transistor 251 in series, wherein the gate of the regulating transistor 251 is connected to the converter 23 and used for receiving the regulating voltage Vreg.

Practically, the regulating voltage Vreg can be used for switching on/off the regulating transistor 251, accordingly, the current on the resistors 252 and 253 would be regulated. And, the voltage on the source of the amplifying transistor 255 can be modulated for achieving the purpose of gain modulation of the amplifier 25. Certainly, the regulating transistor 251 can be directly connected to the bias circuit 200 without the converter 23.

While the first outputting current I1 is increased, the regulating voltage Vreg would be increased as well, however, while the regulating voltage Vreg has not overtook the critical voltage Vt of the regulating transistor 251 yet, the regulating transistor 251 is stayed as switch off, and the gain of the amplifier 25 would be modulated according to the operation bias voltage Vbias and the loading voltage on the resistor 253.

On the contrary, once the first outputting current I1 is staying to be increased, the regulating voltage Vreg would overtake the critical voltage Vt of the regulating transistor 251, and the regulating transistor 251 would be switched on slowly. Thereafter, portion of current would pass through the resistor 252 and the regulating transistor 251, and the voltage on the drain of the amplifying transistor 255 would be regulated, therefore, the gain of the amplifier 25 could be modulated accordingly.

Figure 6:
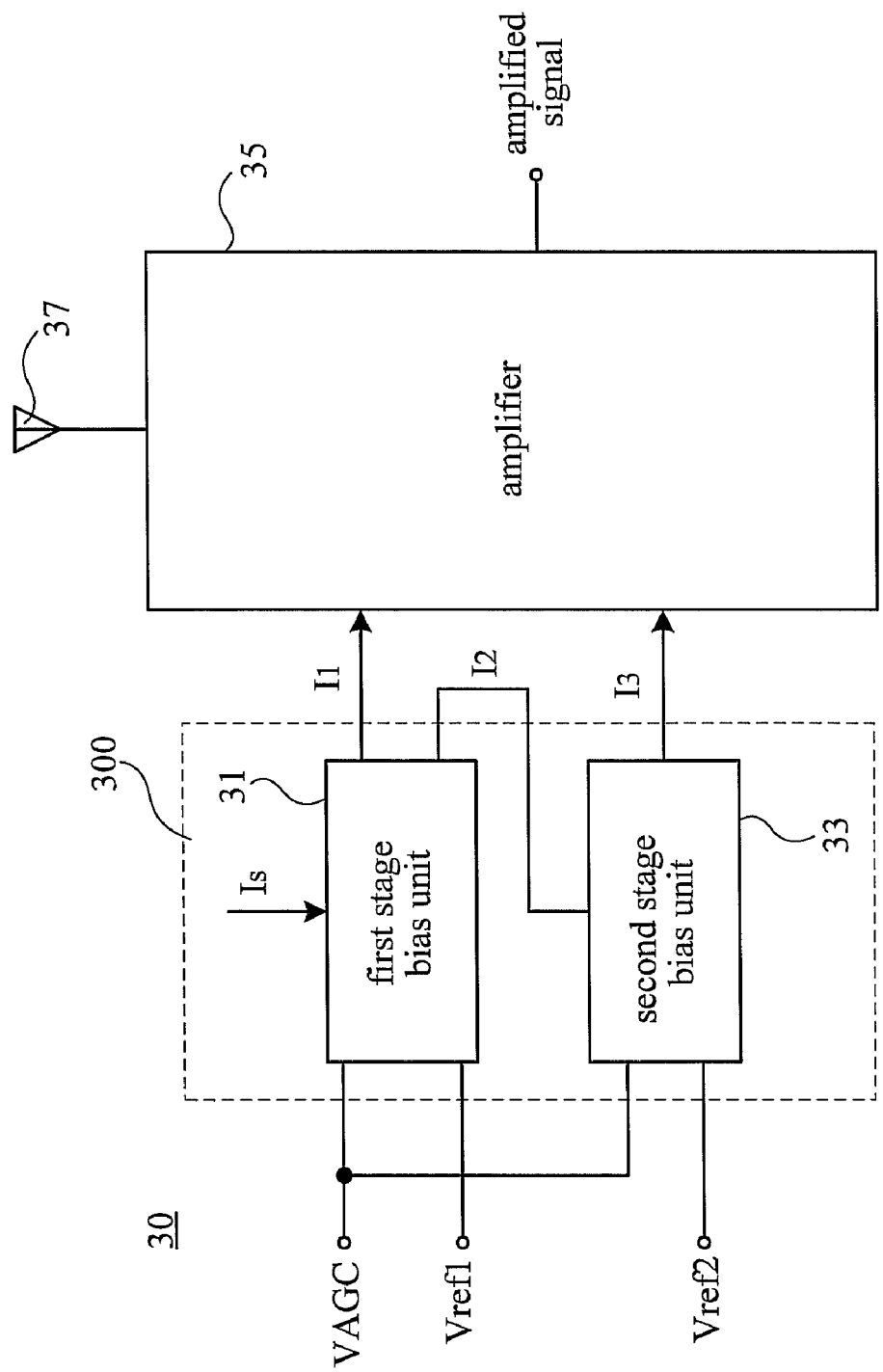
FIG. 6 is a block diagram of another preferred embodiment of the present invention regarding to a bias circuit for the wireless transceiver.

Referring to FIG. 6, a block diagram of another preferred embodiment of the present invention regarding to a bias circuit for the wireless transceiver is showed. The bias circuit can be with more than one stage bias unit. The bias circuit 300 of the wireless transceiver 30 comprises a first stage bias unit 31 and a second stage bias unit 33 that are connected to an amplifier 35 to modulate the gain of the amplifier 35.

Practically, the amplifier 35 receives the first outputting current I1 generated from the first stage bias unit 31 and the third outputting current I3 generated from the second stage bias unit 33 respectively. The gain of the amplifier 35 would be modulated according to the value of the first outputting current I1 and the third outputting current I3, wherein the bias circuit 300 would modulate the gain of the amplifier 35 according to the strength value of the receiving signal through the antenna 37, such that the amplified signal outputted from the amplifier 35 will be supportable to the requirement of the rear-end circuit.

The first stage bias unit 31 receives a constant current Is, a control voltage VAGC, and a first reference voltage Vref1, and generates a first outputting current I1 and the second outputting current I3 according to the constant current Is, the control voltage VAGC, and the first reference voltage Vref1. The second stage bias unit 33 is connected to the first stage bias unit 31, and used for receiving the second outputting current I2, the control voltage VAGC, and a second reference voltage Vref2, and generating a third outputting current I3. The first reference voltage Vref1 and the second reference voltage Vref2 are constant voltages, the control voltage VAGC is variable, and the value of the first outputting current I1 and the third outputting current I3 are controlled according the value of the control voltage VAGC. Furthermore, the first outputting current I1 is regulated according to the opposite of the third outputting current I3, for example, while the first outputting current I1 is increased, the third outputting current I3 would be decreased oppositely.

Regarding to the embodiment of the present invention, the first outputting current I1 and the second outputting current I2 generated from the first stage bias unit 31 and the third outputting current I3 generated from the second stage bias unit 33 can be represented as a smooth curve, in other words, which can be regulated by representing as an analog form, therefore, the gain of the amplifier 35 can be modulated by representing as an analog form as well, such that the transient response can be prevented during the gain modulation accordingly.

Figure 7:
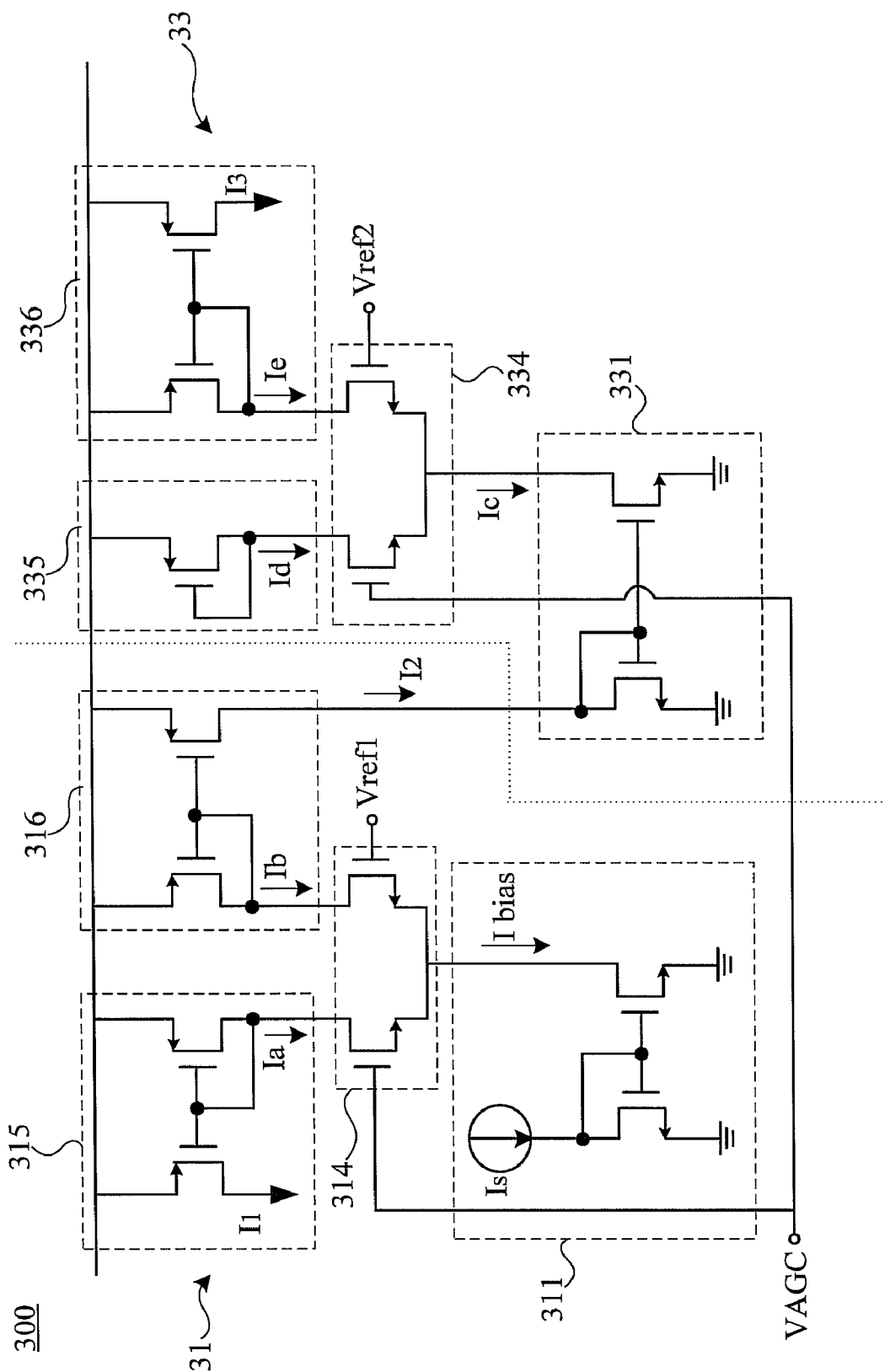
FIG. 7 is a circuit diagram of the preferred embodiment of the present invention regarding to the bias circuit.
Figure 8:
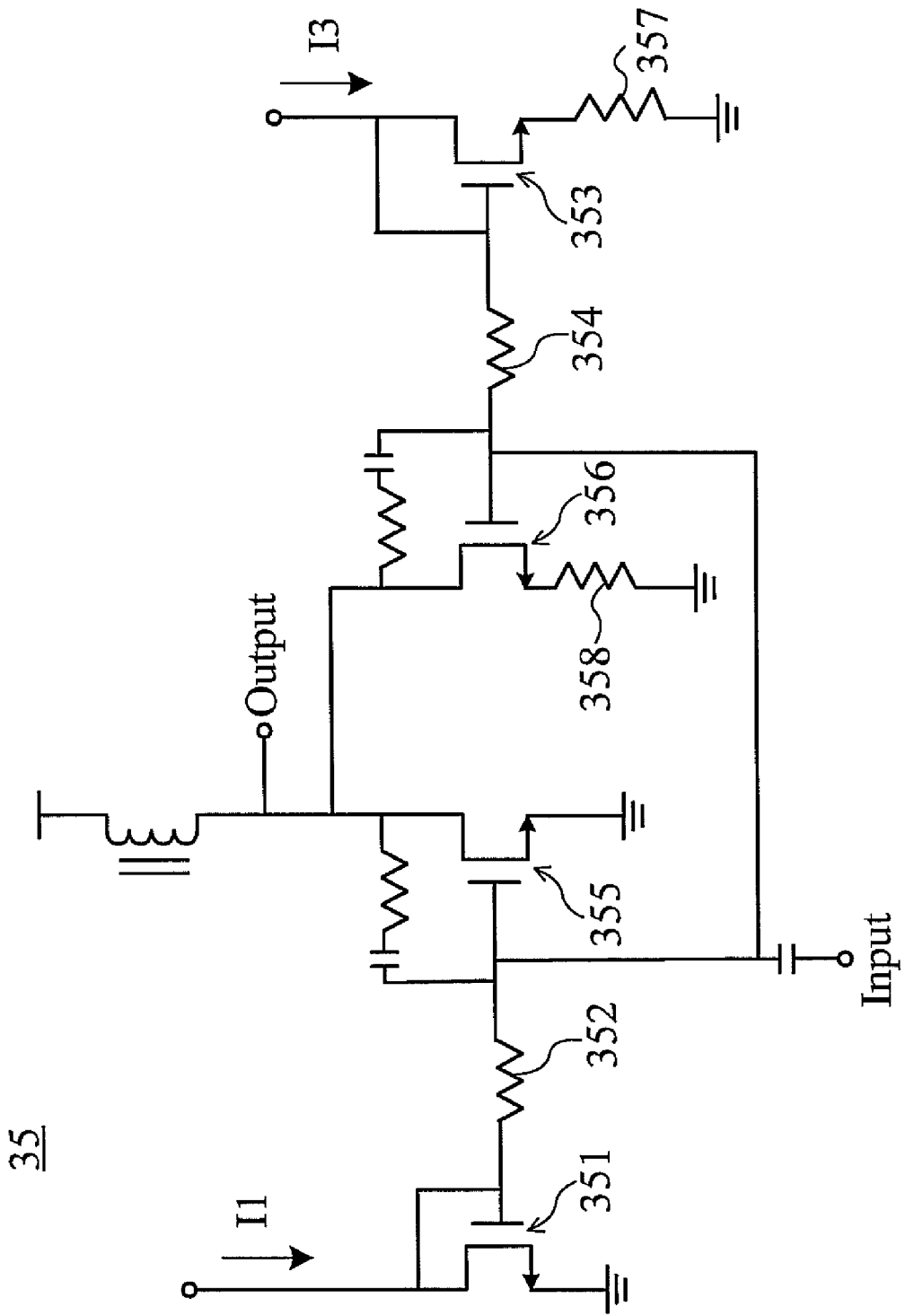
FIG. 8 is a circuit diagram of the preferred embodiment of the present invention regarding to the amplifier that is connected to the bias circuit.

Referring to FIG. 7 and FIG. 8, the bias circuit 300 comprises the first stage bias unit 31 and the second stage bias unit 33, which can be used for generating a first outputting current I1 and a third outputting current I3 respectively to modulate the gain of the amplifier 35. The first stage bias unit 31 comprises a constant current unit 311, a first differential unit 314, a first current mirror 315, and a second current mirror 316, which are as well as the structure as shown on FIG. 3.

The second stage bias unit 33 comprises a third current mirror 331, a second differential unit 334, a load unit 335, and a fourth current mirror 336, wherein the load unit 335 can be selectively as a load transistor or a resistor and so on. The third current mirror 331 is connected to the second current mirror 316 of the first stage bias unit 31, and used for receiving the second outputting current I2 generated from the second current mirror 316, and mirroring the second outputting current I2 to generate the current Ic. The second differential unit 334 is connected to the third current mirror 331, and used for receiving the control voltage VAGC, a second reference voltage Vref2, and the current Ic generated from the third current mirror 331, and generating the currents Id and Ie. The load unit 335 is connected to the second differential unit 334 for receiving the current Id, and the fourth current mirror 336 is connected to the second differential unit 334 for receiving the current Ie and generating a third outputting current I3 according to the mirror of the current Ie.

Figure 9:
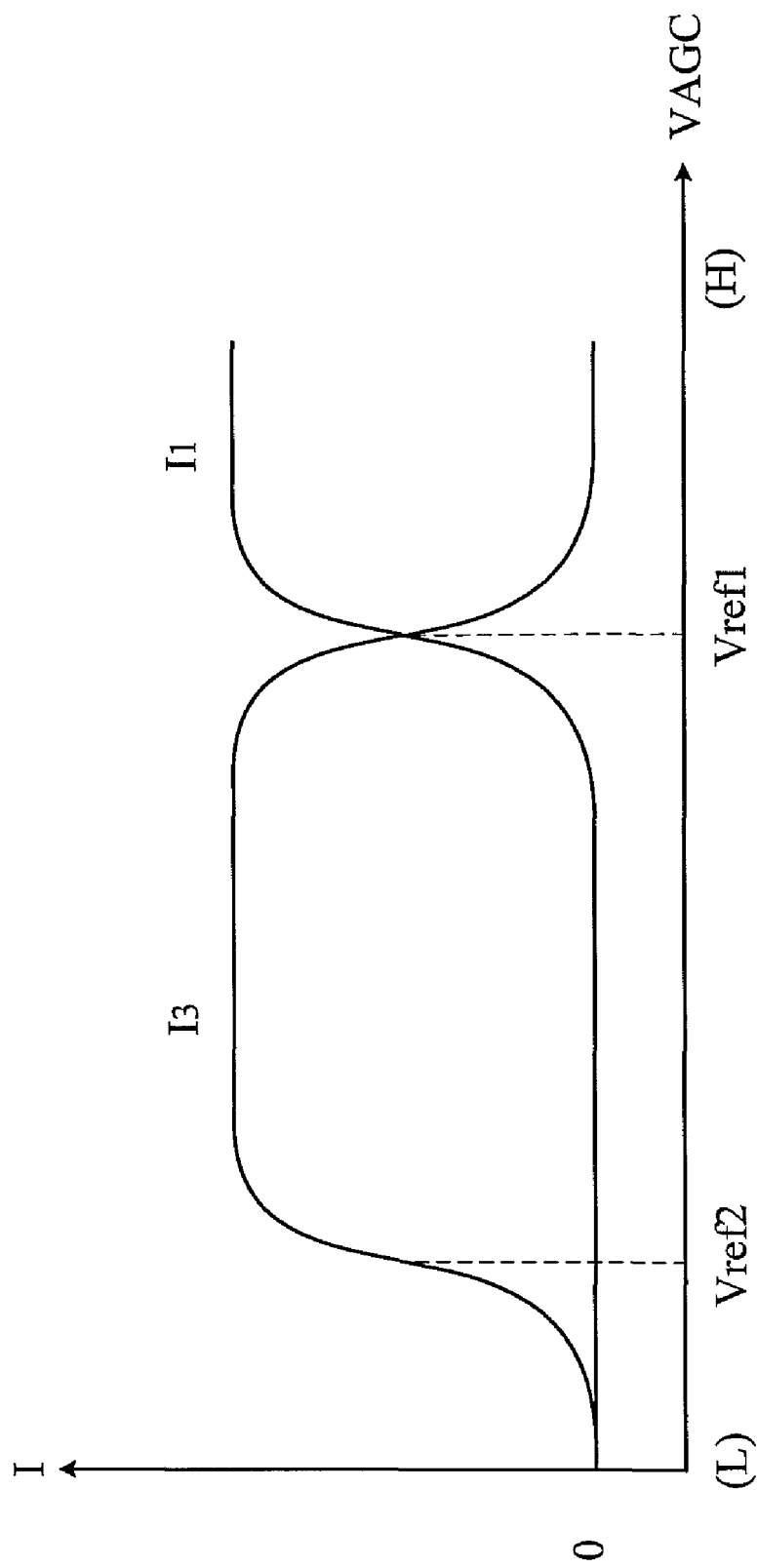
FIG. 9 is an outputting current curve diagram of the preferred embodiment of the present invention regarding to the bias circuit.

The values of the first outputting current I1 and the third outputting current I3 are controlled according to the control voltage VAGC, and the first outputting current I1 is regulated according to the opposite of the third outputting current I3, for example, while the control voltage is increased, the first outputting current I1 would be increased, and the third outputting current I3 would be decreased, which can be represented as the curves shown on FIG. 9, while the control voltage VAGC is increased to the second reference voltage Vref2, the third outputting current I3 would be increased accordingly, while the control voltage VAGC is increased to the first reference voltage Vref1, the first outputting current I1 would be increased and the third outputting current I3 would be decreased. The gain modulation of the amplifier 35 can be switched according to the regulation between the first outputting current I1 and the third outputting current I3, such that more than one stage of the gain modulation can be switched accordingly.

The amplifier 35 comprises a first receiving transistor 351, a second receiving transistor 353, a first amplifying transistor 355, and a second amplifying transistor 356, wherein the gate of the first amplifying transistor 355 is connected to a first load resistor 352, and the gate of the second amplifying transistor 356 is connected to a second load resistor 354, further, the source of the second amplifying transistor 356 is connected to a resistor 358. The first receiving transistor 351 and the second receiving transistor 353 are used for receiving the first outputting current I1 and the third outputting current I3 respectively, wherein the second receiving transistor 353 is further connected to a resistor 357.

Practically, the receiving signal is inputted into the input end of the amplifier 35, and then, the amplifier 35 will amplify the receiving signal and output an amplified signal through the output end of the amplifier 35. The gain of the amplifier 35 is modulated by the first outputting current I1 and the third outputting current I3, wherein the value of the first outputting current I1 and the third outputting current I3 would affect the gate voltages of the first amplifying transistor 355 and the second amplifying transistor 356, such that the purpose of gain modulation of the amplifier 35 can be achieved.

Regarding to the embodiment of the present invention, the second amplifying transistor 356 is connected to a resistor 358, further, regarding to another embodiment of the present invention, the resistor 358 can be a regulating unit 250 also, as shown on FIG. 4, therefore, the range of the gain modulation can be larger and the linear presentation of the amplifier 35 can be improved accordingly.

Figure 10:
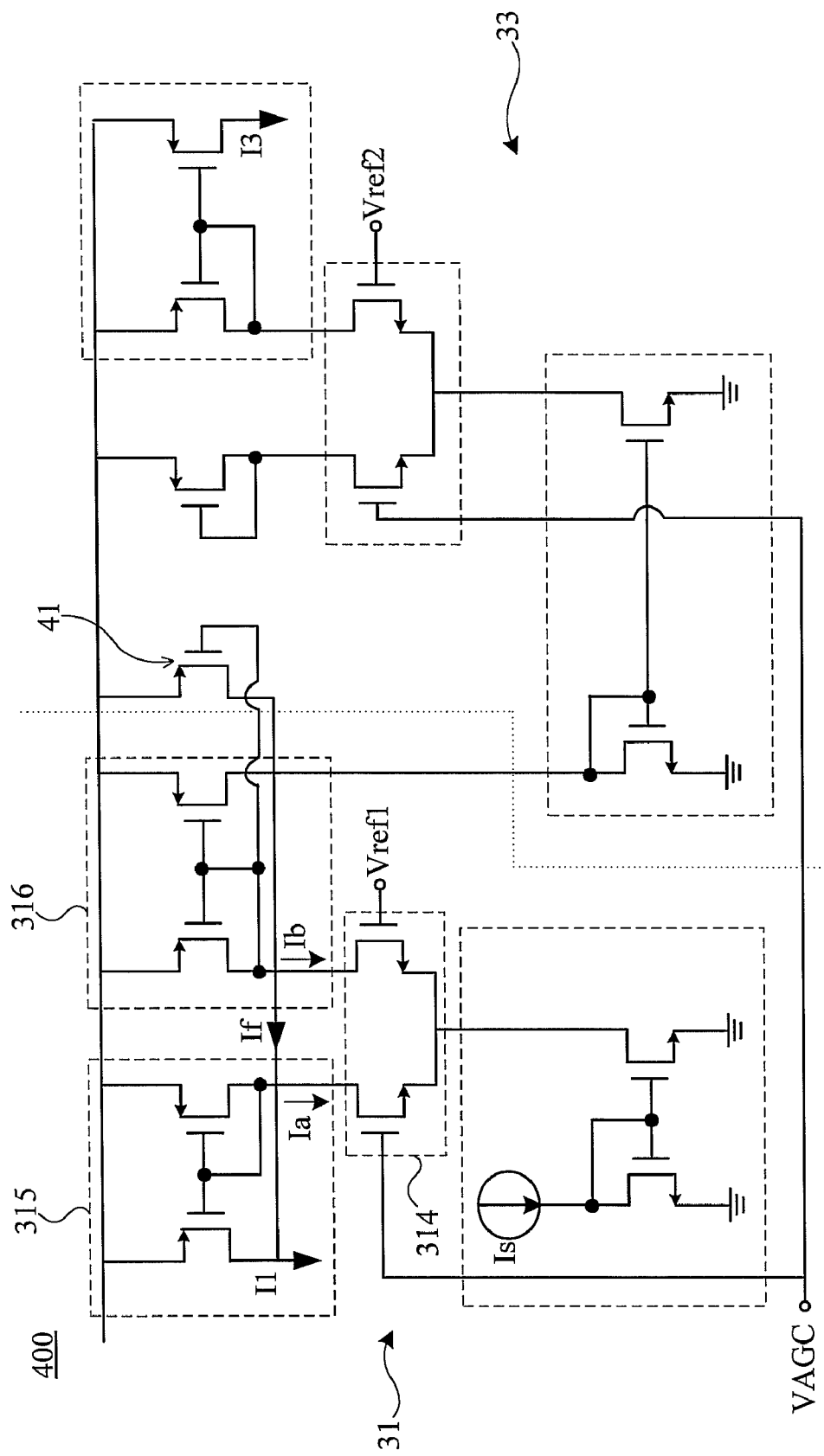
FIG. 10 is a circuit diagram of another preferred embodiment of the present invention regarding to the bias circuit.
Figure 11:
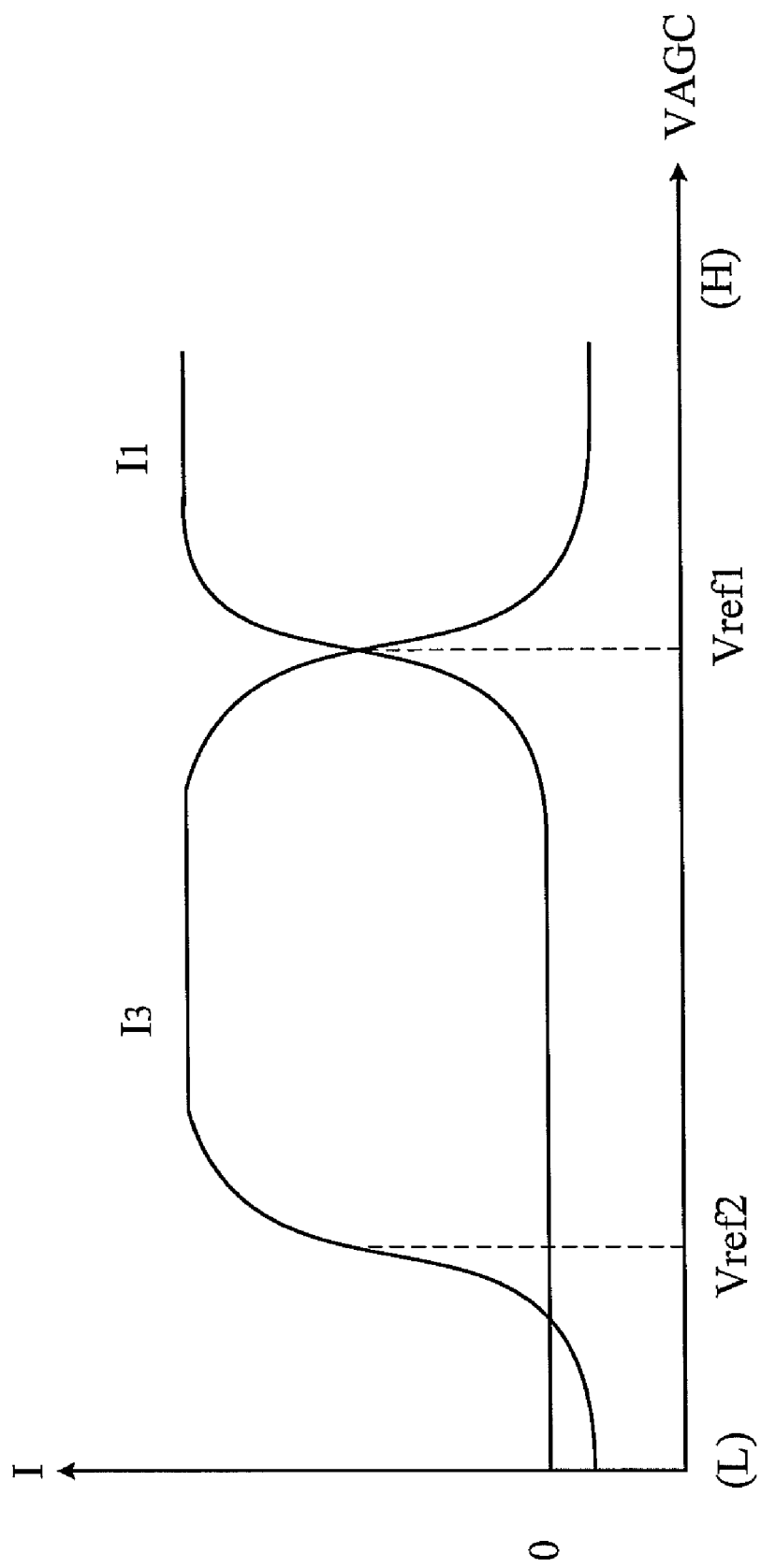
FIG. 11 is an outputting current curve diagram of the preferred embodiment of the present invention regarding to the bias circuit.

Referring to FIG. 10 and FIG. 11, the bias circuit 400 further comprises a feedback transistor 41, such as a P-channel transistor. The gate of the feedback transistor 41 is connected to the second current mirror 316, and further connected to the gate of the transistor of the second current mirror 316, besides, the feedback transistor 41 is connected to the first current mirror 315.

The feedback transistor 41 will mirror the current Ib of the first differential unit 314 and generate a current If, which will be feedback to the first current mirror 315, accordingly, the value of the first outputting current I1 generated from the first current mirror 315 would not be close to the zero due to the control voltage is staying to decrease, and the outputting current is represented as the curve shown on FIG. 11. Comparatively, regarding to the outputting current of the bias circuit 300 represented as the curve, the value of the first outputting current I1 would be close to the zero since the control voltage is staying to decrease. While the value of the first outputting current I1 is zero, the gain linear presentation of the amplifier 35 would be affected, but the feedback transistor 41 can be used for preventing such circumstance.

Regarding to the embodiment of the present invention, while the current Ia is decreased, the current Ib would be increased, and the feedback transistor 41 would generate a current If according to the current Ib, thereafter, the current If would be feedback to the first current mirror 315, such that the value of the first outputting current I1 generated from the first current mirror 315 would not be zero accordingly.

Figure 12:
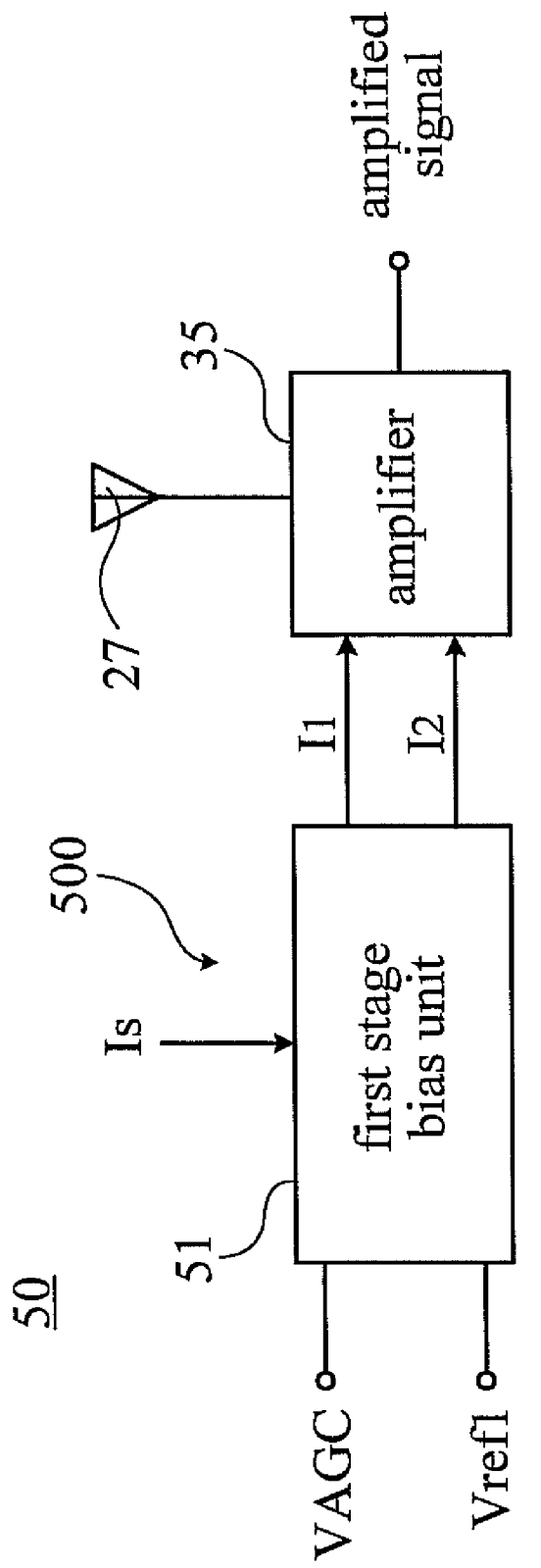
FIG. 12 is a block diagram of a preferred embodiment of the present invention regarding to the bias circuit and the amplifier.

Referring to FIG. 12, a block diagram of a preferred embodiment of the present invention regarding to the bias circuit and the amplifier is showed. The wireless transceiver 50 comprises a bias circuit 500, the amplifier 35, and the antenna 27, wherein the bias circuit 500 comprises a first stage bias unit 51, and the amplifier 35 is connected with the first stage bias unit 51 and the antenna 27 respectively.

The first stage bias unit 51 is used for receiving a constant current Is, a control voltage VAGC, and a first reference voltage Vref1, and generating a first outputting current I1 and the second outputting current I2 according to the constant current Is, the control voltage VAGC, and the first reference voltage Vref1. The control voltage VAGC is variable, and the first outputting current I1 and the second outputting current I2 can be regulated according to the variation of the control voltage VAGC, such that the first outputting current I1 and the second outputting current I2 can be represented as an analog outputting curve, and used for modulating the gain of the amplifier 35.

Figure 13:
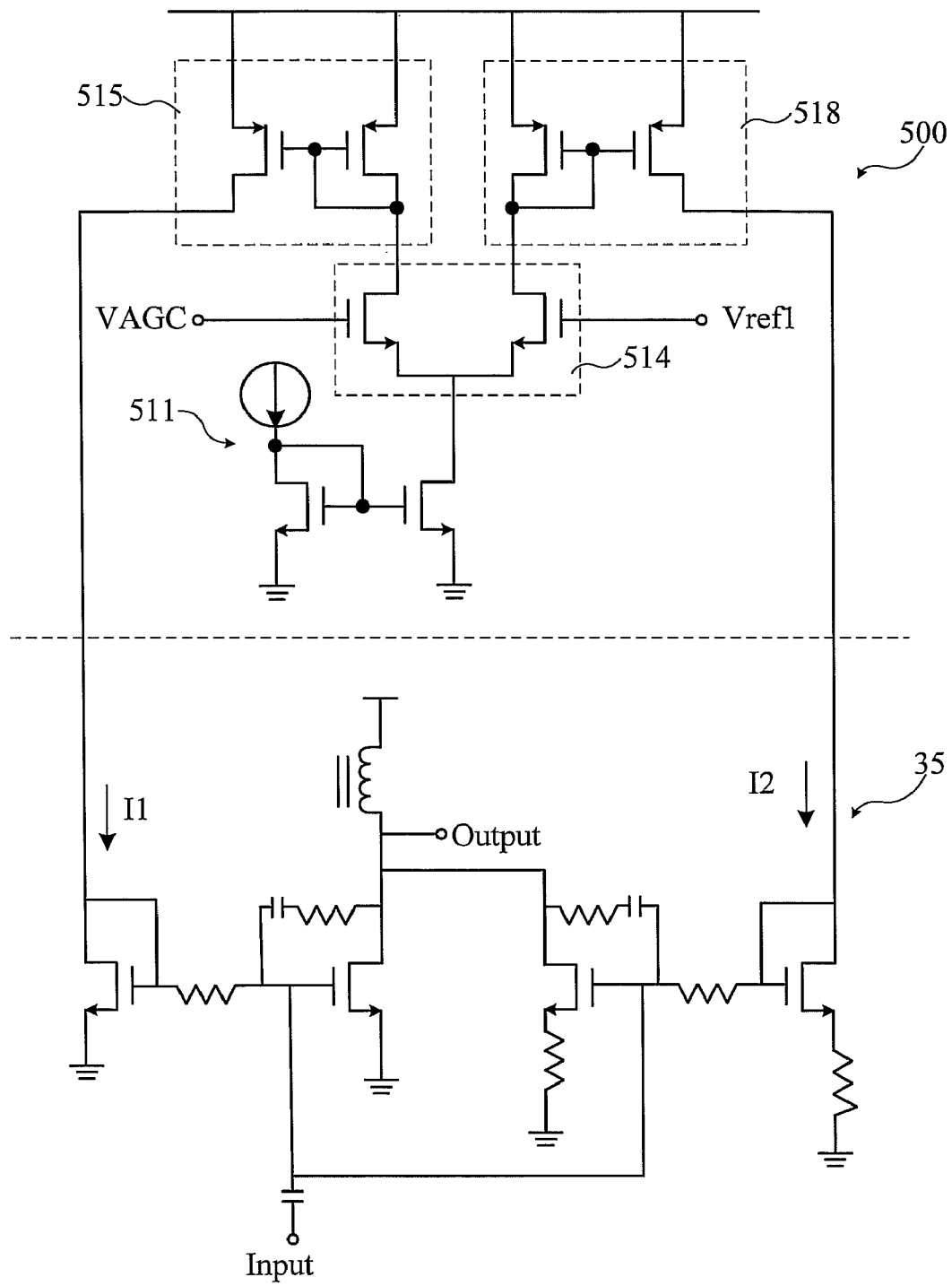
FIG. 13 is a circuit diagram of the preferred embodiment of the present invention regarding to the bias circuit and the amplifier.

Referring to FIG. 13, a circuit diagram of the preferred embodiment of the present invention regarding to the bias circuit and the amplifier is showed. The bias circuit 500 comprises a constant current 511, a first differential unit 514, a first current mirror 515, and a second current mirror 518, wherein the amplifier 35 is connected with the first current mirror 515 and the second current mirror 518 respectively, and used for receiving the first outputting current I1 and the second outputting current I2. Furthermore, the curves representing the first outputting current I1 and the second outputting current I2 generated from bias circuit 500 are showed on FIG. 5, and the gain of the amplifier 35 can be modulated according to the first outputting current I1 and the second outputting current I2.

The bias circuit of the present invention can be not only applied on the amplifier of the front-end circuit of the wireless transceiver, but the amplifier of the rear-end circuit thereof, otherwise, the bias circuit can generate the outputting current or voltage that can be regulated by representing as an analog form, therefore, which is supportable for various amplifiers in respect of the gain modulation thereof, and the transient response of the outputting current, the outputting voltage, and/or the amplifier can be reduced to the lowest one for improving the performance surely.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

We claim:

1. A bias circuit for the wireless transceiver, comprising:
a first stage bias unit receiving a constant current, a control voltage, and a first reference voltage and generating a first outputting current and a second outputting current according to said constant current, said control voltage, and said first reference voltage, wherein the value of said first outputting current is controlled by said control voltage, and increased or decreased by representing as an analog form;

at least one second stage bias unit connected with said first stage bias unit, receiving said control voltage, a second reference voltage, and said second outputting current, and outputting a third outputting current, which is increased or decreased by representing as an analog form.

2. The bias circuit of claim 1, wherein said first stage bias unit and an amplifier are connected with each other, and the gain of said amplifier is controlled by said first outputting current.

3. The bias circuit of claim 2, further comprising a converter provided between said first stage bias unit and said amplifier, and used for converting said first outputting current into a regulating voltage, wherein the gain of said amplifier can be modulated according to the value of said regulating voltage.

4. The bias circuit of claim 1, wherein said first stage bias unit and a converter are connected with each other, wherein said converter is used for converting said first outputting current into a regulating voltage.

5. The bias circuit of claim 1, wherein said first stage bias unit and an amplifier are connected with each other, and the gain of said amplifier is controlled by said first outputting current and said second outputting current.

6. The bias circuit of claim 1, wherein said first stage bias unit and said second stage bias unit are connected with an amplifier, and the gain of said amplifier can be modulated according to the value of said first outputting current and said third outputting current.

7. A bias circuit for the wireless transceiver, comprising:
a constant current unit for generating a bias current;
a first differential unit connected to said constant current unit for receiving a control voltage,
a reference voltage, and said bias current;
a first current mirror connected to said first differential unit for generating a first outputting current; and
a load unit connected to said first differential unit.

8. The bias circuit of claim 7, wherein said constant current unit comprises a current mirror circuit and a constant current source being connected with each other.

9. The bias circuit of claim 7, wherein said first current mirror is connected with an amplifier, wherein the gain of said amplifier is controlled by said first outputting current.

10. The bias circuit of claim 9, further comprising a converter is provided between said first current mirror and said amplifier, wherein said converter is used for converting said first outputting current into a regulating voltage.

11. The bias circuit of claim 10, wherein said converter comprises a resistor and a transistor, both of which are connected in series.

12. The bias circuit of claim 11, wherein converter further comprises a capacitor, which is connected to said resistor and said transistor in parallel.

13. The bias circuit of claim 9, wherein said amplifier comprises a modulating unit.

14. The bias circuit of claim 7, wherein said load unit can be one of a transistor, a resistor, or a second current mirror.

15. The bias circuit of claim 7, wherein said load unit can be a second current mirror to generate a second outputting current.

16. The bias circuit of claim 15, wherein said first current mirror and said second current mirror are connected with an amplifier, and the gain of said amplifier is controlled by said first outputting current and said second outputting current.

17. A bias circuit for the wireless transceiver, comprising:
a first stage bias unit, comprising:
a constant current unit for generating a bias current;
a first differential unit connected to said constant current unit for receiving a control voltage, a first reference voltage, and said bias current;
a first current mirror connected to said first differential unit for generating a first outputting current; and
a second current mirror connected to said first differential unit for generating a second outputting current; and
a second stage bias unit, comprising:
a third current mirror connected to said second current mirror for receiving the second current generated from said second current mirror;
a second differential unit connected to said third current mirror for receiving said control voltage and a second reference voltage;
a load unit connected to said second differential unit; and
a fourth current mirror connected to said second differential unit for generating a third outputting current.

18. The bias circuit of claim 17, wherein said constant current unit comprises a current mirror circuit and a constant current source being connected with each other.

19. The bias circuit of claim 17, wherein said first stage bias unit and said second stage bias unit are connected with an amplifier, and the gain of said amplifier can be modulated according to the value of said first outputting current and said third outputting current.

20. The bias circuit of claim 19, wherein said amplifier comprises a modulating unit.

21. The bias circuit of claim 17, further comprising a feedback transistor, wherein the gate of said feedback transistor is connected to the said second current mirror, and the drain thereof is connected to said first current mirror.

* * * * *